US012505992B2

(12) United States Patent
Tsuchiya

(10) Patent No.: US 12,505,992 B2
(45) Date of Patent: Dec. 23, 2025

(54) PLASMA PROCESSING APPARATUS AND CLEANING METHOD

(71) Applicant: Tokyo Electron Limited, Tokyo (JP)

(72) Inventor: Kazuki Tsuchiya, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 77 days.

(21) Appl. No.: 18/544,468

(22) Filed: Dec. 19, 2023

(65) Prior Publication Data

US 2024/0120185 A1 Apr. 11, 2024

Related U.S. Application Data

(63) Continuation of application No. PCT/JP2022/024025, filed on Jun. 15, 2022.

(30) Foreign Application Priority Data

Jun. 21, 2021 (JP) ................................ 2021-102449

(51) Int. Cl.
*H01J 37/32* (2006.01)

(52) U.S. Cl.
CPC .. *H01J 37/32834* (2013.01); *H01J 37/32633* (2013.01); *H01J 37/32862* (2013.01); *H01J 2237/3343* (2013.01)

(58) Field of Classification Search
CPC ........... H01J 37/32834; H01J 37/32633; H01J 37/32862; H01J 2237/3343; H01J 37/32623; H01J 37/32651; H01J 2237/334; C23C 16/44; H01L 21/3065; H01L 21/31; H01L 21/67017; H05H 1/46
See application file for complete search history.

(56) References Cited

U.S. PATENT DOCUMENTS

2014/0051253 A1* 2/2014 Guha ................ H01J 37/32633 156/345.33
2015/0187545 A1* 7/2015 Lee ................... H01J 37/32834 156/345.1
2022/0051912 A1* 2/2022 Yeh ................... H01J 37/32816

FOREIGN PATENT DOCUMENTS

JP 2001-196313 A 7/2001
JP 2013-084552 A 5/2013
JP 2016-021548 A 2/2016
(Continued)

OTHER PUBLICATIONS

Machine translation of JP 2018195817 (Year: 2018).*
(Continued)

*Primary Examiner* — Erin F Bergner
(74) *Attorney, Agent, or Firm* — XSENSUS LLP

(57) ABSTRACT

The chamber is internally provided with a stage on which a substrate is disposed, and an exhaust port connected to an exhaust system around the stage. The baffle is provided around the stage, and divides a space in the chamber into a processing space where plasma processing is performed on the substrate, and an exhaust space connected to the exhaust port. The switching mechanism switches the baffle between a shield state in which the baffle shields a plasma and a transmissive state in which the baffle allows a plasma to pass therethrough. The controller controls the switching mechanism to switch the baffle from the shield state to the transmissive state or from the transmissive state to the shield state.

20 Claims, 7 Drawing Sheets

(56) References Cited

FOREIGN PATENT DOCUMENTS

JP 2018-195817 A 12/2018

OTHER PUBLICATIONS

International Search Report and Written Opinion mailed on Aug. 2, 2022, received for PCT Application PCT/JP2022/024025, filed on Jun. 15, 2022, 10 pages including English Translation.

* cited by examiner

PLASMA PROCESSING APPARATUS AND CLEANING METHOD

CROSS-REFERENCE TO RELATED APPLICATIONS

This application is a bypass continuation application of international application No. PCT/JP2022/024025 having an international filing date of Jun. 15, 2022 and designating the United States, the international application being based upon and claiming the benefit of priority from Japanese Patent Application No. 2021-102449, filed on Jun. 21, 2021, the entire contents of each are incorporated herein by reference.

TECHNICAL FIELD

The present disclosure relates to a plasma processing apparatus and a cleaning method.

BACKGROUND

Patent Document 1 discloses a plasma processing chamber system including a conductance control structure and an exhaust port that is provided around a stage where a substrate of a chamber is disposed and that is connected to a vacuum pump. The conductance control structure is formed with a slit-shaped opening, and exhaust control can be performed by aligning or shifting the exhaust port and the opening.

CITATION LIST

Patent Documents

Patent Document 1: US2015/0060404A

SUMMARY

The present disclosure provides a technique for efficiently removing deposits in an exhaust space.

A plasma processing apparatus according to an aspect of the present disclosure includes a chamber, a baffle, a switching mechanism, and a controller. The chamber is internally provided with a stage on which a substrate is disposed, and an exhaust port connected to an exhaust system around the stage. The baffle is provided around the stage, and divides a space in the chamber into a processing space where plasma processing is performed on the substrate, and an exhaust space connected to the exhaust port. The switching mechanism switches the baffle between a shield state in which the baffle shields a plasma and a transmissive state in which the baffle allows a plasma to pass therethrough. The controller controls the switching mechanism to switch the baffle from the shield state to the transmissive state or from the transmissive state to the shield state.

According to the present disclosure, deposits in the exhaust space can be efficiently removed.

DETAILED DESCRIPTION

Hereinafter, embodiments of a plasma processing apparatus and a cleaning method disclosed in the present application will be described in detail with reference to the drawings. The present disclosure is not limited to the plasma processing apparatus and the cleaning method.

A plasma processing apparatus for performing plasma processing such as plasma etching on a substrate while reducing a pressure in a chamber is known. In the plasma processing apparatus, a stage on which a substrate is placed is often provided at a center in a chamber, and an exhaust port is often formed near an end of a bottom surface of the chamber in consideration of space limitation and maintainability. In such a plasma processing apparatus, when a pressure in the chamber is reduced by performing exhaust from the exhaust port, a bias of an exhaust property occurs. Therefore, a baffle plate is provided around the stage to make the exhaust property uniform in the plasma processing apparatus.

In the plasma processing apparatus, deposits are deposited in the chamber. For example, in the plasma processing apparatus, deposits are deposited in a processing space where plasma processing is performed in the chamber, and deposits are also deposited in an exhaust space at a side closer to the exhaust port than the baffle plate in the chamber.

Therefore, a technique for efficiently removing deposits in the exhaust space is expected.

First Embodiment

[System Configuration]

Figure 1:
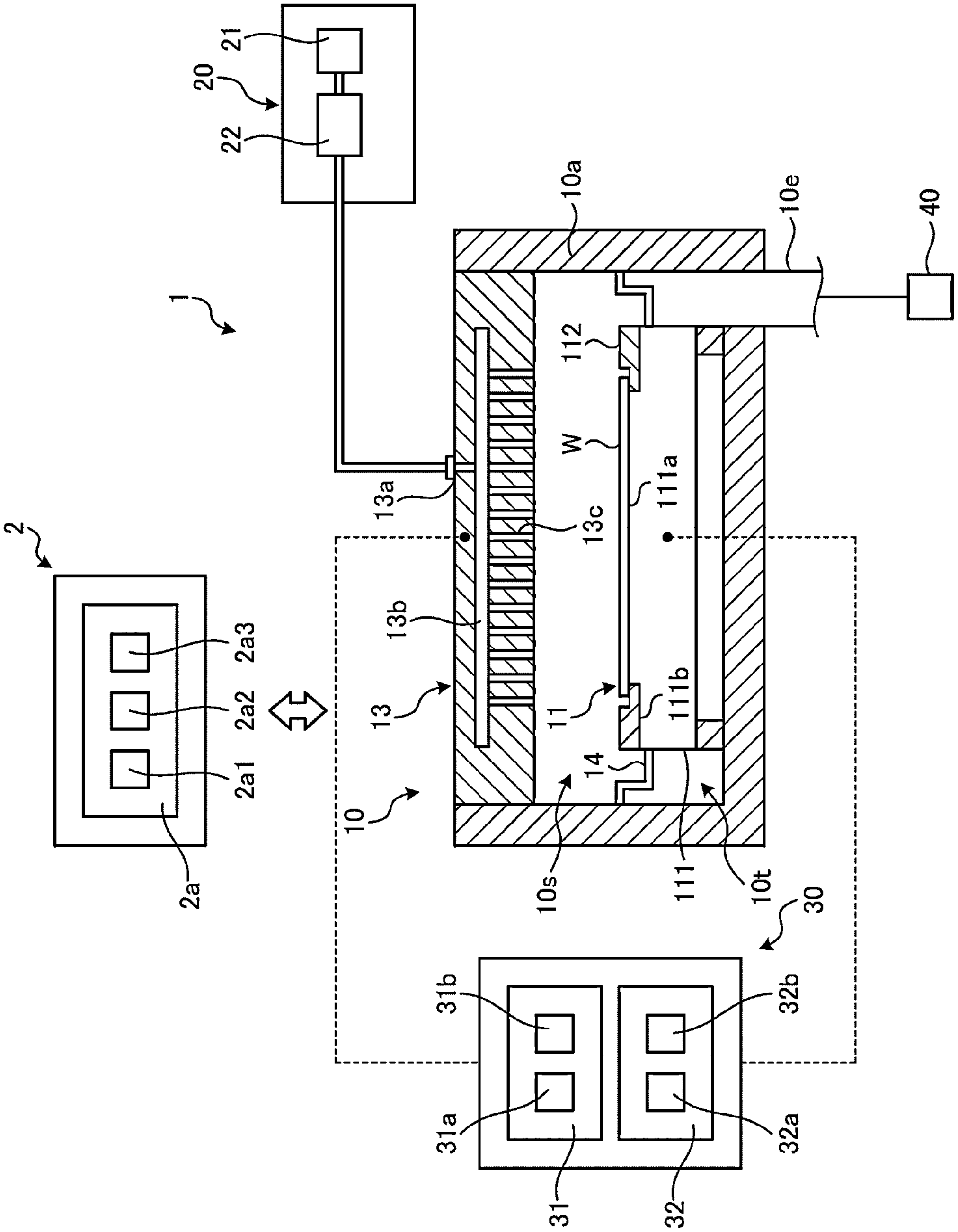
FIG. 1 is a view illustrating an example of a schematic configuration of a plasma processing system according to a first embodiment.

An example of a plasma processing apparatus according to the present disclosure will be described. In the following embodiments, an example will be described in which the plasma processing apparatus according to the present disclosure is a plasma processing system having a system configuration. FIG. 1 is a view illustrating an example of a schematic configuration of a plasma processing system according to a first embodiment.

Hereinafter, a configuration example of a plasma processing system will be described. The plasma processing system includes a capacitively coupled plasma processing apparatus 1 and a controller 2. The capacitively coupled plasma processing apparatus 1 includes a plasma processing chamber 10, a gas supply 20, a power source 30, and an exhaust system 40. Further, the plasma processing apparatus 1 includes a substrate support 11 and a gas introduction unit.

The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space 10*s* defined by the shower head 13, a sidewall 10*a* of the plasma processing chamber 10, and the substrate support 11. The plasma processing chamber 10 has at least one gas supply port for supplying at least one processing gas into the plasma processing space 10*s*, and at least one gas exhaust port for exhausting the gas from the plasma processing space. The sidewall 10*a* is grounded. The shower head 13 and the substrate support 11 are electrically insulated from a housing of the plasma processing chamber 10.

The substrate support 11 includes a main body 111 and a ring assembly 112. The main body 111 has a central region (substrate support surface) 111*a* for supporting a substrate (wafer) W, and an annular region (ring support surface) 111*b* for supporting the ring assembly 112. The annular region 111*b* of the main body 111 surrounds the central region 111*a* of the main body 111 in a plan view. The substrate W is disposed on the central region 111*a* of the main body 111 and the ring assembly 112 is disposed on the annular region 111*b* of the main body 111 to surround the substrate W on the central region 111*a* of the main body 111. In one embodiment, the main body 111 includes a base and an electrostatic chuck. The base includes a conductive member. The conductive member of the base functions as a lower electrode. The electrostatic chuck is disposed on the base. The upper surface of the electrostatic chuck has the substrate support surface 111*a*. The ring assembly 112 includes one or more annular members. At least one of the one or more annular members is an edge ring. Although not illustrated, the substrate support 11 may include a temperature control module configured to adjust at least one of the electrostatic chuck, the ring assembly 112, and the substrate to a target temperature. The temperature control module may include a heater, a heat transfer medium, a flow path, or a combination thereof. A heat transfer fluid, such as brine or gas, flows through the flow path. Further, the substrate support 11 may include a heat transfer gas supply configured to supply a heat transfer gas between the rear surface of the substrate W and the substrate support surface 111*a*.

The shower head 13 is configured to introduce at least one processing gas from the gas supply 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. Further, the shower head 13 includes a conductive member. The conductive member of the shower head 13 functions as an upper electrode. The gas introduction unit may include, in addition to the shower head 13, one or a plurality of side gas injectors (SGI) that are attached to one or a plurality of openings formed in the sidewall 10*a*.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include one or more flow rate modulation devices that modulate or pulse flow rates of at least one processing gas.

The power source 30 includes an RF power source 31 coupled to the plasma processing chamber 10 via at least one impedance matching circuit. The RF power source 31 is configured to supply at least one RF signal (RF power), such as a source RF signal and a bias RF signal, to the conductive member of the substrate support 11 and/or the conductive member of the shower head 13. As a result, plasma is formed from at least one processing gas supplied into the plasma processing space 10*s*. Accordingly, the RF power source 31 may function as at least a portion of a plasma generator configured to generate plasma from one or more processing gases in the plasma processing chamber 10. Further, supplying of the bias RF signal to the conductive member of the substrate support 11 can generate a bias potential in the substrate W to draw an ion component in the formed plasma to the substrate W.

In one embodiment, the RF power source 31 includes a first RF generator 31*a* and a second RF generator 31*b*. The first RF generator 31*a* is coupled to the conductive member of the substrate support 11 and/or the conductive member of the shower head 13 via at least one impedance matching circuit, and configured to generate a source RF signal (source RF power) for plasma generation. In one embodiment, the source RF signal has a frequency in the range of 13 MHz to 150 MHz. In one embodiment, the first RF generator 31*a* may be configured to generate a plurality of source RF signals having different frequencies. The generated one or a plurality of source RF signals are supplied to the conductive member of the substrate support 11 and/or the conductive member of the shower head 13. The second RF generator 31*b* is coupled to the conductive member of the substrate support 11 via at least one impedance matching circuit, and configured to generate a bias RF signal (bias RF power). In one embodiment, the bias RF signal has a lower frequency than the source RF signal. In one embodiment, the bias RF signal has a frequency in the range of 400 kHz to 13.56 MHz. In one embodiment, the second RF generator 31*b* may be configured to generate a plurality of bias RF signals having different frequencies. The generated one or more bias RF signals are supplied to the conductive member of the substrate support 11. Further, in various embodiments, at least one of the source RF signal and the bias RF signal may be pulsed.

Further, the power source 30 may include a DC power source 32 coupled to the plasma processing chamber 10. The DC power source 32 includes a first DC generator 32*a* and a second DC generator 32*b*. In one embodiment, the first DC generator 32*a* is connected to the conductive member of the substrate support 11 and configured to generate a first DC signal. The generated first bias DC signal is applied to the conductive member of the substrate support 11. In one embodiment, the first DC signal may be applied to another electrode, such as an electrode in an electrostatic chuck. In one embodiment, the second DC generator 32*b* is configured to be connected to the conductive member of the shower head 13 and to generate a second DC signal. The generated second DC signal is applied to the conductive member of the shower head 13. In various embodiments, at least one of the first and second DC signals may be pulsed. The first and second DC generators 32*a* and 32*b* may be provided in addition to the RF power source 31, and the first DC generator 32*a* may be provided instead of the second RF generator 31*b*.

The plasma processing chamber 10 is formed in a cylindrical shape in which a space is formed, and the substrate support 11 described above is disposed at the center in the plasma processing chamber 10. The substrate W having a columnar shape and subjected to plasma processing is placed on the substrate support 11. A gas exhaust port 10*e* for exhausting the inside of the plasma processing chamber 10 is formed at a position lower than the substrate support 11 around the substrate support 11. In the plasma processing apparatus 1 according to the first embodiment, the gas exhaust port 10*e* is formed at a bottom portion of the plasma processing chamber 10.

The exhaust system 40 may be connected to, for example, the gas exhaust port 10*e* disposed at a bottom portion of the plasma processing chamber 10. The exhaust system 40 may include a pressure adjusting valve and a vacuum pump. The pressure in the plasma processing space 10*s* is adjusted by the pressure adjusting valve. The vacuum pump may include a turbo molecular pump, a dry pump, or a combination thereof.

The plasma processing chamber 10 includes a baffle plate 14 around the substrate support 11. The baffle plate 14 has a flat annular shape. Flat planes are formed on an inner peripheral side and an outer peripheral side of the baffle plate 14 according to the first embodiment, and a stepped portion is formed such that the outer peripheral side is higher than the inner peripheral side. The baffle plate 14 may be formed of a plane having no stepped portion. The baffle plate 14 is disposed in a manner of surrounding a periphery of the substrate support 11. The inner peripheral side of the baffle plate 14 is fixed to the substrate support 11, and the outer peripheral side of the baffle plate 14 is fixed to an inner sidewall of the plasma processing chamber 10. The baffle plate 14 is formed to be conductive. For example, the baffle plate 14 is made of a conductive material such as a conductive metal. The baffle plate 14 is electrically connected to the sidewall 10*a* of the plasma processing chamber 10 and is grounded through the sidewall 10*a*. A large number of slits are formed in the baffle plate 14, and a gas can pass through the baffle plate 14. The inside of the plasma processing chamber 10 is divided by the baffle plate 14 into the plasma processing space 10*s* that is a processing space where plasma processing is performed on the substrate W and an exhaust space 10*t* that includes the gas exhaust port 10*e*. The plasma processing space 10*s* is a space upstream of the baffle plate 14 relative to a flow of an exhaust gas toward the gas exhaust port 10*e*. The exhaust space 10*t* is a space downstream of the baffle plate 14 relative to a flow of the exhaust gas toward the gas exhaust port 10*e*.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include, for example, a computer 2*a*. For example, the computer 2*a* may include a processor (central processing unit (CPU)) 2*a*1, a storage unit 2*a*2, and a communication interface 2*a*3. The processor 2*a*1 may be configured to perform various control operations based on a program stored in the storage unit 2*a*2. The storage unit 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 via a communication line such as a local area network (LAN).

Next, a flow of performing plasma processing such as plasma etching on the substrate W by the plasma processing system according to the embodiment will be described briefly. The substrate W is placed on the substrate support 11 by a conveyance device such as a conveyance arm (not illustrated). When the plasma processing is performed, the plasma processing apparatus 1 reduces a pressure in the plasma processing chamber 10 using the exhaust system 40. The plasma processing apparatus 1 supplies a processing gas from the gas supply 20 and introduces the processing gas through the shower head 13 into the plasma processing chamber 10. Then, the plasma processing apparatus 1 supplies at least one RF signal from the RF power source 31 to generate a plasma in the plasma processing space 10*s*, and performs the plasma processing on the substrate W.

When the plasma processing is performed, deposits are deposited in the plasma processing chamber 10. The deposits are deposited in the plasma processing space 10*s*, and the deposits are likely to be deposited in the exhaust space 10*t* at a side close to the gas exhaust port 10*e* of the baffle plate 14 in the plasma processing chamber 10. The deposits include products generated by the plasma processing, ash generated by heat, and the like.

When the plasma processing is performed, deposits are deposited in the plasma processing space 10*s* and the exhaust space 10*t* in the plasma processing apparatus 1. Therefore, the plasma processing apparatus 1 performs cleaning processing for removing the deposits. When the cleaning processing is performed, the plasma processing apparatus 1 reduces a pressure in the plasma processing chamber 10 using the exhaust system 40. The plasma processing apparatus 1 supplies a cleaning gas from the gas supply 20, and introduces the cleaning gas through the shower head 13 into the plasma processing chamber 10. Then, the plasma processing apparatus 1 supplies at least one RF signal from the RF power source 31 to generate a plasma in the plasma processing space 10*s*, and performs plasma cleaning. Dry cleaning may be performed after placing a dummy substrate on the substrate support 11 in order to protect a surface of the substrate support 11.

The cleaning gas may be any type of gas as long as deposits can be removed. For example, when the deposits are organic products generated from an etching gas during an etching process on the substrate W, examples of the cleaning gas include an oxygen-containing gas such as $O_2$, $O_3$, CO, and $CO_2$. In addition, when the deposits are organic films containing a metal such as tungsten (W) and titanium (Ti), examples of the cleaning gas include an oxygen-containing gas such as $O_2$, CO, $O_3$, and $CO_2$, a gas obtained by adding a halogen-containing gas such as $CF_4$, $Cl_2$ to the oxygen-containing gas, a $F_2$ gas, and a $ClF_3$ gas. Further, when the deposits are deposits obtained by metal etching such as ruthenium (Ru), cobalt (Co), and iron (Fe), examples of the cleaning gas include a methanol ($CH_3OH$) gas. Further, a plurality of types of gases may be switched and supplied as the cleaning gas. When the deposits are stacked films of a plurality of products or organic films, a gas type may be selected and supplied as the cleaning gas according to a type of a film exposed on an outermost surface of the stacked films. When the cleaning processing is performed at the same time with the plasma processing including a plurality of pieces of step processing in which reaction products serving as deposits are different, the cleaning gas may be switched for each step processing.

Here, in order to improve processing efficiency of the plasma processing and improve uniformity on the substrate W, the baffle plate 14 shields a plasma such that a plasma generated in the plasma processing space 10*s* does not flow into the exhaust space 10*t* in the plasma processing apparatus 1 in the related art.

However, since a plasma of the cleaning gas during plasma cleaning is also shielded by the baffle plate 14, a cleaning rate of deposits in the exhaust space 10*t* is low and the deposits cannot be completely separated in the plasma processing apparatus 1 in the related art.

Figure 2:
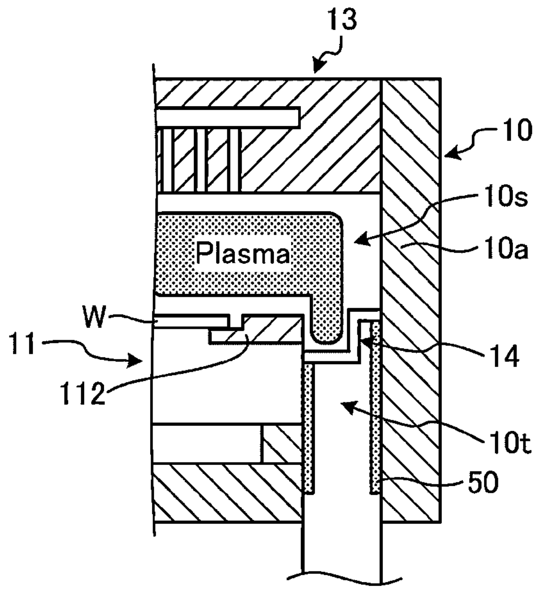
FIG. 2 is a view illustrating deposition of deposits in an exhaust space according to the first embodiment.

FIG. 2 is a view illustrating deposition of deposits in the exhaust space 10*t* according to the first embodiment. FIG. 2 is an enlarged view illustrating the vicinity of a side surface of the substrate support 11 of the plasma processing chamber 10. In FIG. 2, a plasma is shielded by the baffle plate 14. Therefore, when a cumulative time in the plasma processing is long, for example, deposits 50 are deposited on wall surfaces of the substrate support 11 and the sidewall 10*a* below the baffle plate 14 in the plasma processing apparatus 1 in the related art. When the deposits 50 are deposited in the exhaust space 10*t*, for example, the following problems occur. The deposits 50 in the exhaust space 10*t* become a dust source of particles. Further, the deposits 50 in the exhaust space 10*t* may fall to a pressure adjusting valve of the exhaust system 40 to change an opening degree of the pressure adjusting valve, and a pressure in the plasma processing chamber 10 may be changed. In the plasma processing apparatus 1 in the related art, it is necessary to manually remove the deposits 50 every maintenance cycle, which takes time for the maintenance.

Therefore, in the plasma processing apparatus 1 according to the embodiment, the baffle plate 14 can be switched between a shield state in which the baffle plate 14 shields a plasma and a transmissive state in which the baffle plate 14 allows a plasma to pass therethrough. For example, a plurality of slits are formed in the baffle plate 14 according to the first embodiment, and the baffle plate 14 can be switched between the shield state and the transmissive state by changing widths of the slits. The baffle plate 14 has an opening formed along a circumferential direction of the substrate support 11. The baffle plate 14 according to the first embodiment has an opening formed in a flat plane on an inner peripheral side. The baffle plate 14 may have an opening 14*b* or blades 15 to be described later on a flat plane or a stepped surface on an outer peripheral side.

Figure 3:
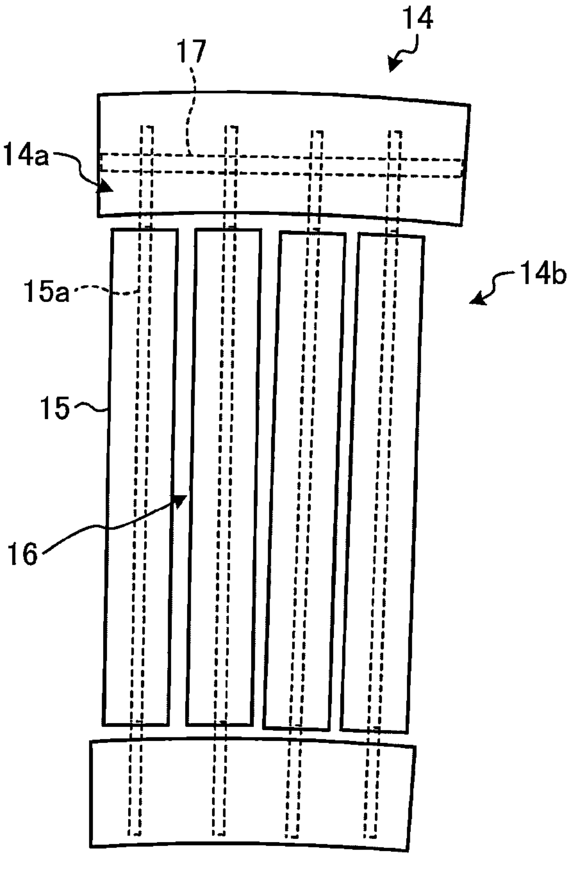
FIG. 3 is a view illustrating an example of a configuration of a baffle plate according to the first embodiment.

FIG. 3 is a view illustrating an example of a configuration of the baffle plate 14 according to the first embodiment. FIG. 3 shows a flat plane 14*a* on the inner peripheral side of the baffle plate 14. The opening 14*b* is formed in the plane 14*a* along a circumferential direction of the baffle plate 14. A plurality of blades 15 are disposed side by side in the opening 14*b*. Each blade 15 is fixed to a rod-shaped shaft 15*a*, and is rotatable around the shaft 15*a* serving as a rotation axis. Gaps that function as slits 16 are formed between the blades 15. The shaft 15*a* of each blade 15 is supported in a rotatable manner by the plane 14*a* sandwiching the opening 14*b* of the baffle plate 14. The shaft 15*a* of each blade 15 is rotated by a switching mechanism. The plane 14*a* of the baffle plate 14 is provided with a shaft 17 serving as the switching mechanism. The shaft 15*a* of each blade 15 is provided with a worm gear, and rotation of the shaft 17 is transmitted to the shaft 15*a* through the worm gear to rotate the shaft 15*a*. The shaft 17 is rotated by a drive force of a power source such as a servo motor (not illustrated). The controller 2 can control the power source to control the rotation of the shaft 17, thereby controlling a rotation angle of each blade 15. The switching mechanism according to the first embodiment may have any configuration as long as each blade 15 can be rotated around the shaft 15*a* serving as a rotation axis.

Figure 4:
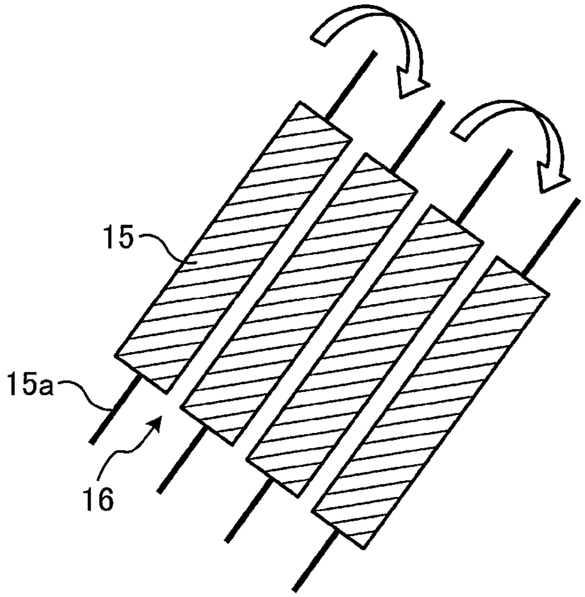
FIG. 4 is a view illustrating an example of blades according to the first embodiment.
Figure 5:
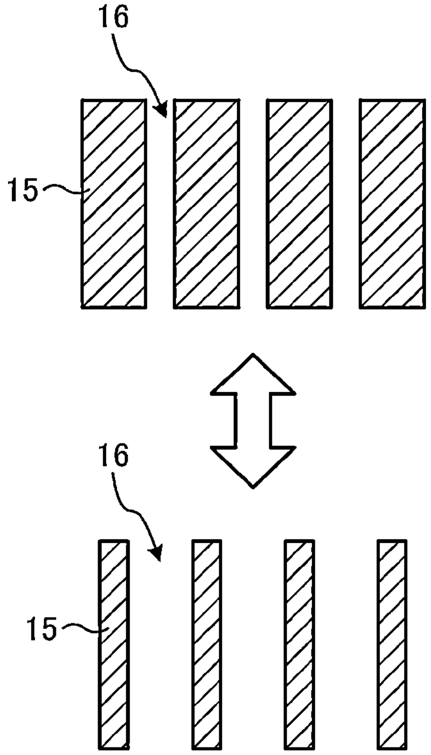
FIG. 5 is a view illustrating an example of a change of slits according to the first embodiment.

FIG. 4 is a view illustrating an example of the blades 15 according to the first embodiment. As described above, each blade 15 is rotatable around the shaft 15*a* serving as a rotation axis. The baffle plate 14 changes a width of the slit 16 (the gap) between the blades 15 by changing a rotation angle of each blade 15. FIG. 5 is a view illustrating an example of a change of the slit 16 according to the first embodiment. For example, the width of the slit 16 is narrowed by placing a plane of each blade 15 in a horizontal state, and the width of the slit 16 is widened by placing a plane of each blade 15 in a vertical state in the baffle plate 14.

Figure 6:
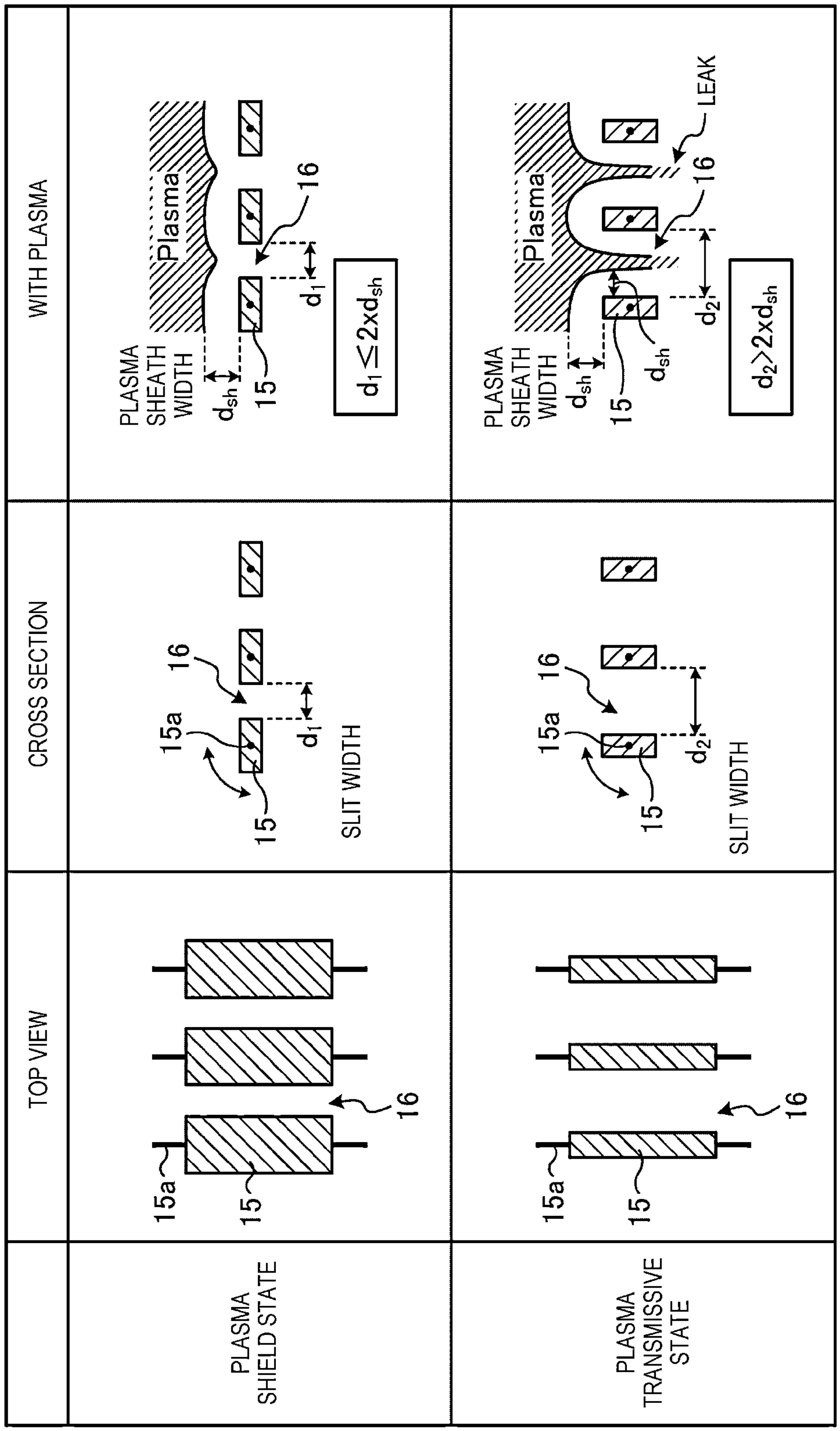
FIG. 6 is a view illustrating a shield state and a transmissive state of the baffle plate according to the first embodiment.

The baffle plate 14 according to the first embodiment can be switched between the shield state in which the baffle plate 14 shields a plasma and the transmissive state in which the baffle plate 14 allows a plasma to pass therethrough by controlling a rotation angle of each blade 15 to change the width of the slit 16. FIG. 6 is a view illustrating the shield state and the transmissive state of the baffle plate 14 according to the first embodiment. When the width of the slit 16 is smaller than twice a sheath width of the plasma, the baffle plate 14 does not allow the plasma to pass through the slit 16 and shields the plasma. When the width of the slit 16 is twice or more the sheath width of the plasma, the baffle plate 14 allows the plasma to pass through the slit 16, and transmits the plasma. The baffle plate 14 is configured such that when the plane of each blade 15 is horizontal, a width $d_1$ of the slit 16 is smaller than twice a sheath width $d_{sh}$ of the plasma, and when the plane of each blade 15 is vertical, a width $d_2$ of the slit 16 is twice or more the sheath width $d_{sh}$.

The controller 2 controls the baffle plate 14 to be in the shield state when the plasma processing is performed on the substrate W, and controls the baffle plate 14 to be in the transmissive state when the plasma cleaning is performed in the plasma processing chamber 10.

For example, the controller 2 controls the rotation angle of each blade 15 by controlling the power source to control the width of the slit 16 of the baffle plate 14. When the plasma processing is performed, the controller 2 controls the baffle plate 14 to be in the shield state by setting the width of the slit 16 of the baffle plate 14 to be smaller than twice the sheath width of the plasma. For example, when the plasma processing is performed, the controller 2 controls the rotation angle such that the plane of each blade 15 is horizontal to set the baffle plate 14 to the shield state. Accordingly, since the plasma generated in the plasma processing space 10*s* during the plasma processing performed on the substrate W is shielded by the baffle plate 14 and remains in the plasma processing space 10*s*, processing efficiency of the plasma processing is improved in the plasma processing apparatus 1. The plasma processing apparatus 1 can perform the plasma processing with high uniformity on the substrate W.

When the plasma cleaning is performed, the controller 2 controls the baffle plate 14 to be in the transmissive state by setting the width of the slit 16 of the baffle plate 14 to be twice or more the sheath width of the plasma. For example, when the plasma processing is performed, the controller 2 controls the rotation angle such that the plane of each blade 15 is vertical to set the baffle plate 14 to the transmissive state. Accordingly, the plasma generated in the plasma processing space 10*s* during the plasma cleaning is transmitted through the baffle plate 14 and flows into the exhaust space 10*t*, and thus the plasma processing apparatus 1 can efficiently remove deposits in the exhaust space 10*t*.

Figure 7:
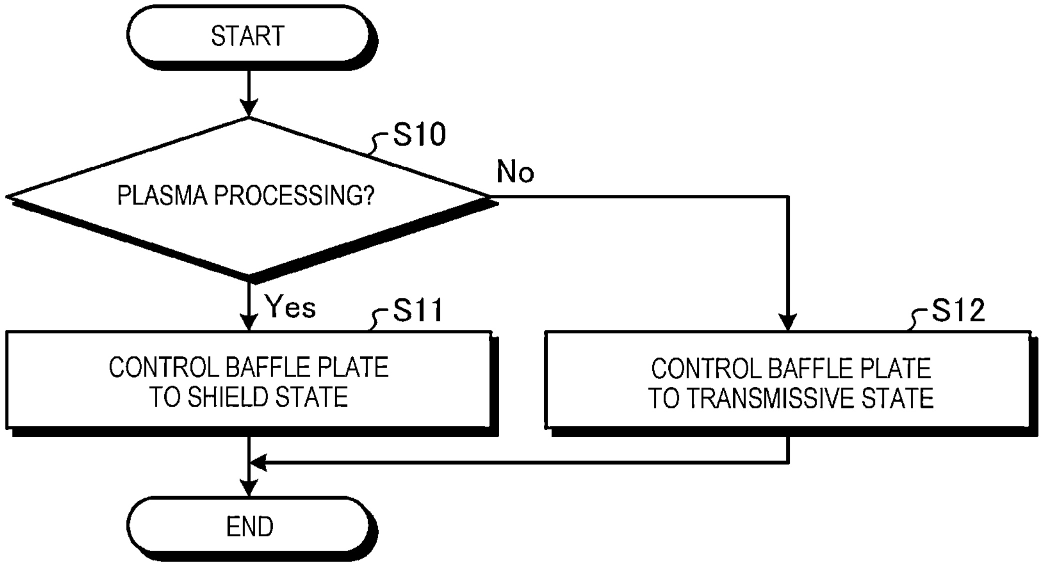
FIG. 7 is a view illustrating an example of a processing sequence of a cleaning method according to the embodiment.

Next, a flow of processing of a cleaning method performed by the plasma processing apparatus 1 according to the embodiment will be described. FIG. 7 is a view illustrating an example of a processing sequence of a cleaning method according to the embodiment. The processing of the cleaning method shown in FIG. 7 is performed when the plasma processing is performed on the substrate W or the plasma cleaning is performed.

The controller 2 determines whether processing to be performed is the plasma processing (S10). When the processing to be performed is the plasma processing (S10: Yes), the controller 2 controls the baffle plate 14 to the shield state (S11), and ends the processing. For example, the controller 2 controls the rotation angle of each blade 15 by controlling the power source, and sets the width of the slit 16 of the baffle plate 14 to be smaller than twice the sheath width of the plasma to set the baffle plate 14 to the shield state.

On the other hand, when the processing to be performed is the plasma cleaning and is not the plasma processing (S10: No), the controller 2 controls the baffle plate 14 to be in the transmissive state (S12), and ends the processing. For example, the controller 2 controls the rotation angle of each blade 15 by controlling the power source, and sets the width of the slit 16 of the baffle plate 14 to be twice or more the sheath width of the plasma to set the baffle plate 14 to be in the transmissive state.

Figure 8:
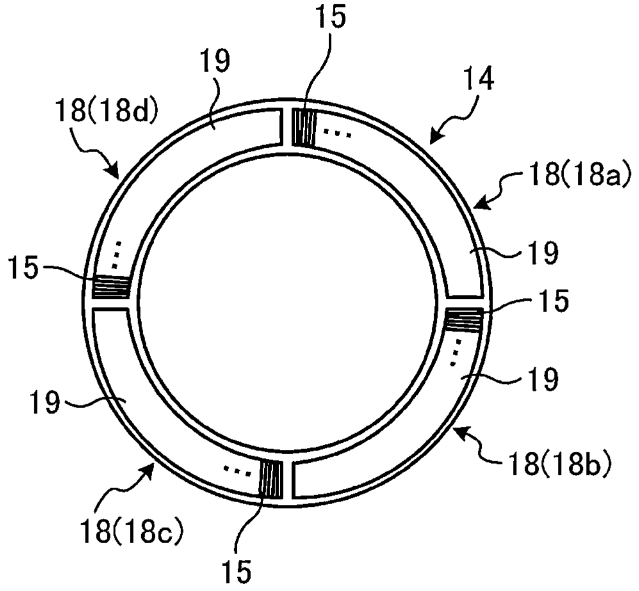
FIG. 8 is a view illustrating another example of the configuration of the baffle plate according to the first embodiment.

Although an example is described in the first embodiment in which the entire periphery of the baffle plate 14 can be uniformly switched between the shield state and the transmissive state, the present disclosure is not limited thereto. The baffle plate 14 may be divided into a plurality of regions along the circumferential direction of the substrate support 11, and the regions may be individually switched between the shield state and the transmissive state. FIG. 8 is a view illustrating another example of the configuration of the baffle plate 14 according to the first embodiment. The baffle plate 14 has a flat annular shape. The baffle plate 14 is divided into, for example, four regions 18 (18*a* to 18*d*) along the circumferential direction. The four regions 18 each have an opening 19, and a plurality of blades 15 are disposed side by side in the opening 19. The baffle plate 14 is configured such that the rotation angle of the blade 15 of each region 18 can be controlled by a switching mechanism.

Figure 9:
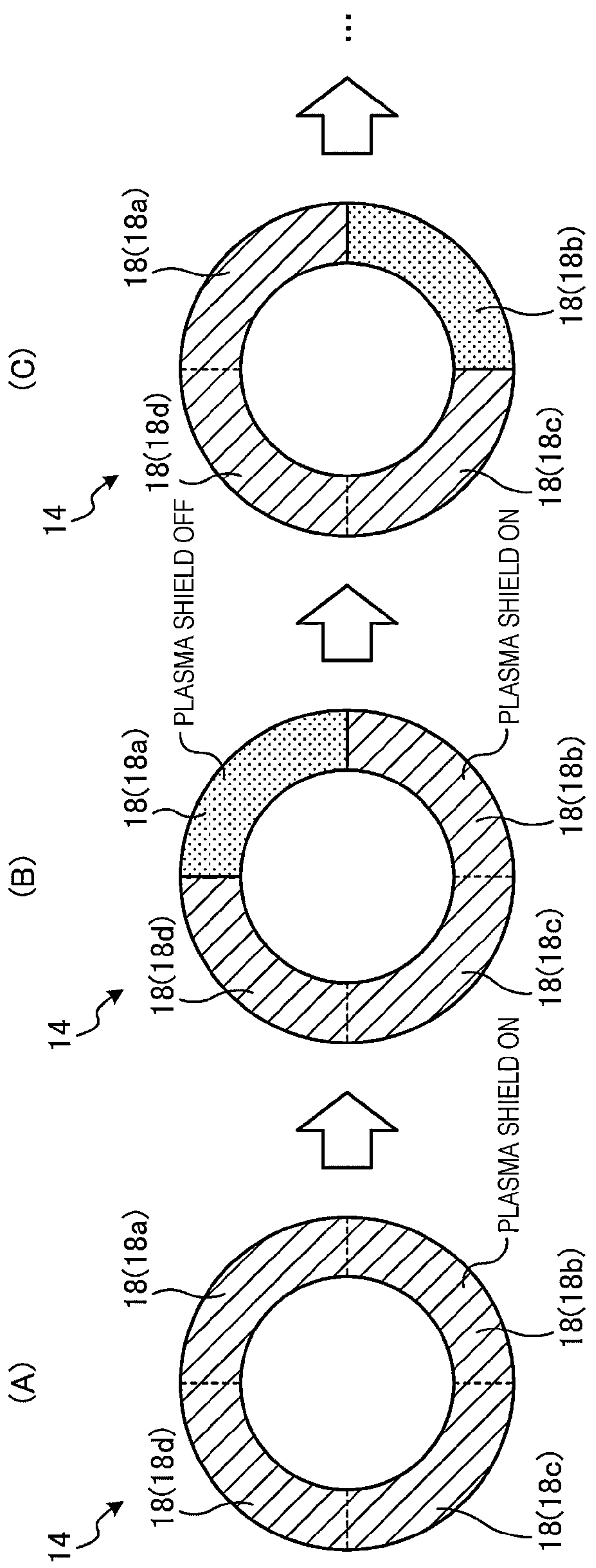
FIG. 9 is a view illustrating an example of switching regions set to the transmissive state during plasma cleaning according to the first embodiment.

When the plasma processing is performed on the substrate W, the controller 2 controls all of the regions 18 of the baffle plate 14 to be in the shield state, and when the plasma cleaning is performed in the plasma processing chamber 10, the controller 2 controls a part or all of the regions 18 of the baffle plate 14 to be in the transmissive state. For example, when the plasma cleaning is performed in the plasma processing chamber 10, the controller 2 controls the four regions 18 of the baffle plate 14 to be in the transmissive state sequentially. FIG. 9 is a view illustrating an example of switching regions 18 set to the transmissive state during plasma cleaning according to the first embodiment. In FIG. 9, a diagonal-line pattern is given to the region 18 in the shield state, and a dot pattern is given to the region 18 in the transmissive state. In (A) of FIG. 9, all of the regions 18*a* to 18*d* are in the shield state. In (B) of FIG. 9, the regions 18*b* to 18*d* are set to the shield state, and shielding is set to OFF in the region 18*a* and the region 8*a* is set to the transmissive state. In (C) of FIG. 9, the regions 18 are sequentially controlled to be in the transmissive state, and the region 18*b* is switched to the transmissive state and the region 18*a* is switched to the shield state from the states shown in (B) of FIG. 9. Accordingly, the plasma processing apparatus 1 can locally and intensively causes a plasma of a cleaning gas to flow into the exhaust space 10*t* through the region 18 set to the transmissive state during the plasma cleaning. Accordingly, the plasma processing apparatus 1 can efficiently remove, at a high rate, deposits in the exhaust space 10*t* through the region 18 set to the transmissive state. Further, the plasma processing apparatus 1 controls the regions 18 of the baffle plate 14 to be in the transmissive state sequentially, thereby sequentially switching the regions 18 in the transmissive state, and the entire exhaust space 10*t* can be cleaned.

When the baffle plate 14 is configured as shown in FIG. 8, the plasma processing apparatus 1 can partially adjust a pressure in the plasma processing chamber 10 by adjusting an inclination of the blade 15 in each region 18. For example, since a pressure on a surface of the substrate W can be partially adjusted in the circumferential direction during the plasma processing, the plasma processing apparatus 1 can also be used to eliminate a bias of an etching rate. Further, since a plasma density on the baffle plate 14 is reduced when a part of the baffle plate 14 is set to the transmissive state during the plasma processing, a plasma density on the surface of the substrate W can be partially adjusted in the circumferential direction, and the plasma processing apparatus 1 can also be used to eliminate a bias of an etching rate.

Although the region 18 is divided into four regions in FIG. 8, the present disclosure is not limited thereto. For example, the region 18 may be divided into two or more regions. Deposits in the exhaust space 10*t* can be further efficiently removed through the region 18 set to the transmissive state at a high rate by dividing the region 18 into further more regions such as 8 regions and 12 regions. Further, finer partial adjustment can be performed for the pressure or the plasma density in the circumferential direction during the plasma processing, and the plasma processing apparatus 1 can also be used to eliminate a bias of an etching rate.

As described above, the plasma processing apparatus 1 according to the first embodiment includes the plasma processing chamber 10 (a chamber), the baffle plate 14, the switching mechanism (the shaft 17, a motor that rotationally drives the shaft 17, and the like), and the controller 2. The plasma processing chamber 10 is internally provided with the substrate support 11 (a stage) on which the substrate W is disposed, and the gas exhaust port 10*e* (an exhaust port) connected to an exhaust system around the substrate support 11. The baffle plate 14 is provided around the substrate support 11, and divides a space in the plasma processing chamber 10 into the plasma processing space 10*s* where the plasma processing is performed on the substrate W and the exhaust space 10*t* connected to the gas exhaust port 10*e*. The switching mechanism switches the baffle plate 14 between the shield state in which the baffle plate 14 shields a plasma and the transmissive state in which the baffle plate 14 allows a plasma to pass therethrough. When a plasma is generated in the plasma processing chamber 10 and the plasma processing is performed on the substrate W, the controller 2 controls the switching mechanism to set the baffle plate 14 to the shield state. Further, when the plasma cleaning is performed in the plasma processing chamber 10, the controller 2 controls the switching mechanism to set the baffle plate 14 to the transmissive state. Accordingly, the plasma processing apparatus 1 can efficiently remove deposits in the exhaust space 10*t*.

Further, the baffle plate 14 is formed with a plurality of slits 16. The switching mechanism switches the baffle plate 14 between the shield state and the transmissive state by changing widths of the slits 16. In this manner, the plasma processing apparatus 1 can switch the baffle plate 14 between the shield state and the transmissive state by changing the widths of the slits 16 of the baffle plate 14.

The baffle plate 14 has the opening 14*b* formed along a periphery of the substrate support 11, a plurality of blades 15 fixed to the shafts 15*a* are disposed side by side in the opening 14*b*, and the slits 16 are formed between the blades 15. The switching mechanism switches the baffle plate 14 between the shield state and the transmissive state by rotating the shafts 15*a* of the blades 15 to change the widths of the slits 16. Accordingly, the plasma processing apparatus 1 can switch the baffle plate 14 between the shield state and the transmissive state by rotating the blades 15 disposed in the opening 14*b*.

The switching mechanism switches the baffle plate 14 to the shield state by setting the width of the slit 16 to be smaller than twice the sheath width of the plasma, and switches the baffle plate 14 to the transmissive state by setting the width of the slit 16 to be twice or more the sheath width. Accordingly, the plasma processing apparatus 1 can switch the baffle plate 14 between the shield state and the transmissive state.

Further, the baffle plate 14 is divided into a plurality of regions 18 along the circumferential direction of the substrate support 11, and the regions 18 can be individually switched between the shield state and the transmissive state. The switching mechanism individually switches the regions 18 between the shield state and the transmissive state. Accordingly, the plasma processing apparatus 1 can locally and intensively causes a plasma of a cleaning gas to flow into the exhaust space 10*t*, and can locally perform cleaning.

When the plasma processing is performed on the substrate W, the controller 2 controls the switching mechanism to set the regions 18 of the baffle plate 14 to the shield state. Further, when the plasma cleaning is performed in the plasma processing chamber 10, the controller 2 controls the switching mechanism to set a part of or all of the regions 18 of the baffle plate 14 to the transmissive state. Accordingly, the plasma processing apparatus 1 can cause a plasma of a cleaning gas flow into the exhaust space 10*t* through the region 18 set to the transmissive state, and can locally or entirely clean a part of the exhaust space 10*t*.

When the plasma cleaning is performed in the plasma processing chamber 10, the controller 2 controls the switching mechanism to sequentially set the regions 18 of the baffle plate 14 to the transmissive state. Accordingly, the plasma processing apparatus 1 can locally and intensively cause a plasma of a cleaning gas to flow into the exhaust space 10*t* through the region 18 set to the transmissive state, and thus deposits in the exhaust space 10*t* can be efficiently removed through the region 18 set to the transmissive state at a high rate. Further, the plasma processing apparatus 1 controls the regions 18 of the baffle plate 14 to be in the transmissive state sequentially, thereby sequentially switching the regions 18 in the transmissive state, and the entire exhaust space 10*t* can be cleaned.

Second Embodiment

Next, a second embodiment will be described. Since the plasma processing system, the plasma processing apparatus 1, and the controller 2 according to the second embodiment have the same configurations as those in the first embodiment, descriptions of the same portions will be omitted, and differences will be mainly described.

Figure 10:
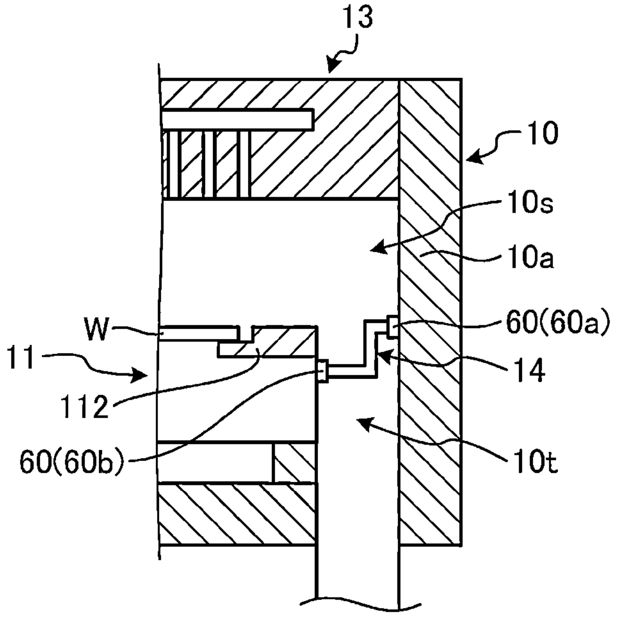
FIG. 10 is a view illustrating a configuration of a plasma processing apparatus according to a second embodiment.

FIG. 10 is a view illustrating a configuration of a plasma processing apparatus 1 according to a second embodiment. FIG. 10 is an enlarged view illustrating the vicinity of a side surface of the substrate support 11 of the plasma processing chamber 10.

Similar to the first embodiment, the baffle plate 14 is provided around the substrate support 11. A large number of slits are formed in the baffle plate 14, and a gas can pass through the baffle plate 14. Each slit is formed to have a width smaller than twice the sheath width of the plasma.

The baffle plate 14 can be switched between the shield state in which the baffle plate 14 shields a plasma and the transmissive state in which the baffle plate 14 allows a plasma to pass therethrough. For example, the baffle plate 14 according to the second embodiment can be switched between a ground potential and a floating state. The baffle plate 14 is provided with an insulating member such as a dielectric at an inner peripheral portion in contact with the substrate support 11 and at an outer peripheral portion in contact with the sidewall 10*a*, and is insulated from the substrate support 11 and the sidewall 10*a*. Further, switches 60 (60*a*, 60*b*) that switch the substrate support 11, the sidewall 10*a*, and the baffle plate 14 between a conductive state and a non-conductive state are provided at one or more locations along the circumferential direction of the baffle plate 14. The controller 2 switches the baffle plate 14 between the ground potential and the floating state by controlling ON and OFF of the switches 60.

When the switch 60 is turned on, the baffle plate 14 is electrically connected to the sidewall 10*a* switched to the ground potential and is switched to the ground potential, thereby to the shield state, and when the switch 60 is turned off, the baffle plate 14 is switched to the floating state, thereby to the transmissive state.

The controller 2 controls the baffle plate 14 to be in the shield state when the plasma processing is performed on the substrate W, and controls the baffle plate 14 to be in the transmissive state when the plasma cleaning is performed in the plasma processing chamber 10. For example, the controller 2 controls the switch 60 to be turned on to set the baffle plate 14 to the shield state. Accordingly, since the plasma generated in the plasma processing space 10*s* during the plasma processing performed on the substrate W is shielded by the baffle plate 14 and remains in the plasma processing space 10*s*, processing efficiency of the plasma processing is improved in the plasma processing apparatus 1. The plasma processing apparatus 1 can perform the plasma processing with high uniformity on the substrate W. When the plasma cleaning is performed, the controller 2 controls the switch 60 to be turned off to set the baffle plate 14 to the transmissive state. Accordingly, the plasma generated in the plasma processing space 10*s* during the plasma cleaning is transmitted through the baffle plate 14 and flows into the exhaust space 10*t*, and thus the plasma processing apparatus 1 can efficiently remove deposits in the exhaust space 10*t*.

Although an example is described in the second embodiment in which the entire periphery of the baffle plate 14 can be uniformly switched between the shield state and the transmissive state, the present disclosure is not limited thereto. In the second embodiment, the baffle plate 14 may also be divided into a plurality of regions along the circumferential direction of the substrate support 11, and the regions may be individually switched between the shield state and the transmissive state. The baffle plate 14 is divided into a plurality of regions along the circumferential direction of the substrate support 11, and is configured such that the regions can be individually switched between the ground potential and the floating state, so that the regions can be individually switched between the shield state and the transmissive state.

Although the switch 60 includes two switches of the switch 60*a* between the substrate support 11 and the baffle plate 14 and the switch 60*b* between the sidewall 10*a* and the baffle plate 14, the present disclosure is not limited thereto. For example, the switch 60 may include only one of the switch 60*a* and the switch 60*b*, and the other one that is not a switch may be fixed by an insulator. The substrate support 11 and the baffle plate 14, and the sidewall 10*a* and the baffle plate 14 may both be fixed by an insulator, may be connected to another ground potential location via another switch by a lead wire from the baffle plate 14, and the baffle plate 14 may be switched between the shield state and the transmissive state by turning on and turning off the switch.

As described above, the plasma processing apparatus 1 according to the second embodiment includes the switching mechanism. The switching mechanism can switch the baffle plate 14 between the ground potential and the floating state. The switching mechanism switches the baffle plate 14 to the shield state by switching the baffle plate 14 to the ground potential and switches the baffle plate 14 to the transmissive state by switching the baffle plate 14 to the floating state. In this manner, the plasma processing apparatus 1 can switch the baffle plate 14 between the shield state and the transmissive state by switching the baffle plate 14 between the ground potential and the floating state.

The switching mechanism is provided at a connection location between a conductive member set to a ground potential and the baffle plate 14, and is implemented as the switch 60 that switches the conductive member and the baffle plate 14 between a conductive state and a non-conductive state. Accordingly, the plasma processing apparatus 1 can easily switch the baffle plate 14 between the ground potential and the floating state by using the switch 60.

Hitherto, the embodiment has been described above. The embodiment disclosed herein is illustrative and should not be construed as limiting in all aspects. The embodiment described above may be embodied in various forms. The embodiment described above may be omitted, replaced, or modified in various forms without departing from the scope and spirit of the claims.

For example, although an example is described in the above embodiments in which the plasma processing is performed on a semiconductor wafer serving as the substrate W, the present disclosure is not limited thereto. The substrate W may be any substrate.

Although an example is described in which the controller 2 controls the switching mechanism to switch the baffle plate 14 to the shield state during the plasma processing and to switch the baffle plate 14 to the transmissive state during the cleaning processing, the present disclosure is not limited thereto. For example, when the deposits 50 on the substrate W, on the substrate support 11, and on a wall surface of the sidewall 10*a* of the plasma processing space 10*s* are mainly cleaned, the baffle plate 14 may also be switched to the shield state even during the same cleaning processing. That is, the controller 2 may control the switching mechanism to switch the baffle plate 14 to the shield state during the cleaning processing. For example, when ashing is performed to remove a mask on the substrate W during the plasma processing, the wall surface of the sidewall 10*a* of the exhaust space 10*t* can also be cleaned at the same time by switching the baffle plate 14 to the transmissive state, and throughput can be improved. Further, since a plasma density on the baffle plate 14 is reduced when a part of the baffle plate 14 is set to the transmissive state during the plasma processing, a plasma density on the surface of the substrate W can be partially adjusted in the circumferential direction, and the plasma processing apparatus 1 can also be used to eliminate a bias of an etching rate. That is, the controller 2 may control the switching mechanism to switch the baffle plate 14 to the transmissive state during the plasma processing.

Although an example is described in the above embodiments in which the plasma processing apparatus performs plasma etching as the plasma processing, the present disclosure is not limited thereto. The plasma processing apparatus may be any apparatus as long as the apparatus performs plasma processing on the substrate W. For example, the plasma processing apparatus may be a film forming apparatus or the like that generates a plasma to form a film.

It shall be understood that the embodiments disclosed herein are illustrative and are not restrictive in all aspects. Indeed, the above-described embodiments can be implemented in various forms. The embodiments described above may be omitted, replaced, or modified in various forms without departing from the scope and spirit of the appended claims.

With respect to the above-described embodiments, the following appendixes will be further disclosed.

APPENDIX 1

A plasma processing apparatus including:

- a chamber internally provided with a stage on which a substrate is disposed and provided with an exhaust port connected to an exhaust system around the stage;
- a baffle provided around the stage and configured to divide a space in the chamber into a processing space where plasma processing is performed on the substrate and an exhaust space connected to the exhaust port;
- a switching mechanism configured to switch the baffle between a shield state in which the baffle shields a plasma and a transmissive state in which the baffle allows a plasma to pass therethrough; and
- a controller configured to control the switching mechanism to switch the baffle from the shield state to the transmissive state or from the transmissive state to the shield state.

APPENDIX 2

The plasma processing apparatus according to Appendix 1, in which the controller controls the switching mechanism to switch the baffle to the shield state when a plasma is generated in the chamber and the plasma processing is performed on the substrate, and to switch the baffle to the transmissive state when plasma cleaning is performed in the chamber.

APPENDIX 3

The plasma processing apparatus according to Appendix 1 or 2, in which the baffle has a plurality of slits, and the switching mechanism switches the baffle between the shield state and the transmissive state by changing widths of the slits.

APPENDIX 4

The plasma processing apparatus according to any one of Appendices 1 to 3, in which the baffle has an opening formed along a periphery of the stage, a plurality of blades fixed to axes are disposed side by side in the opening, and slits are formed between the blades, and the switching mechanism switches the baffle between the shield state and the transmissive state by rotating the axes of the blades to change widths of the slits.

APPENDIX 5

The plasma processing apparatus according to Appendix 3 or 4, in which the switching mechanism switches the baffle to the shield state by setting the widths of the slits to be smaller than twice a sheath width of the plasma, and switches the baffle to the transmissive state by setting the widths of the slits to twice or more the sheath width.

APPENDIX 6

The plasma processing apparatus according to Appendix 1 or 2, in which the switching mechanism is configured to switch the baffle between a ground potential and a floating state, switch the baffle to the shield state by switching the baffle to the ground potential, and switch the baffle to the transmissive state by switching the baffle to the floating state.

APPENDIX 7

The plasma processing apparatus according to Appendix 6, in which the switching mechanism is provided at a connection location between a conductive member set to a ground potential and the baffle, and is implemented as a switch configured to switch the conductive member and the baffle between a conductive state and a non-conductive state.

APPENDIX 8

The plasma processing apparatus according to any one of Appendices 1 to 7, in which the baffle is divided into a plurality of regions along a circumferential direction of the stage, the regions are individually switchable between the shield state and the transmissive state, and the switching mechanism individually switches the regions between the shield state and the transmissive state.

APPENDIX 9

The plasma processing apparatus according to Appendix 8, in which the controller controls the switching mechanism to switch the regions of the baffle to the shield state when the plasma processing is performed on the substrate, and switch a part or all of the regions of the baffle to the transmissive state when the plasma cleaning is performed in the chamber.

APPENDIX 10

The plasma processing apparatus according to Appendix 9, in which the controller controls the switching mechanism to sequentially switch the regions of the baffle to the transmissive state when the plasma cleaning is performed in the chamber.

APPENDIX 11

A cleaning method for a plasma processing apparatus including a chamber internally provided with a stage on which a substrate is disposed and provided with an exhaust port connected to an exhaust system around the stage, a baffle provided around the stage and configured to divide a space in the chamber into a processing space where plasma processing is performed on the substrate and an exhaust space connected to the exhaust port, and a switching mechanism configured to switch the baffle between a shield state in which the baffle shields a plasma and a transmissive state in which the baffle allows a plasma to pass therethrough, the cleaning method including:

controlling the switching mechanism to switch the baffle from the shield state to the transmissive state or from the transmissive state to the shield state.

The invention claimed is:

1. A plasma processing apparatus comprising:

a chamber that is internally provided with a stage on which a substrate is able to be disposed and that is provided with an exhaust port connected to an exhaust system;

a baffle provided around the stage and configured to divide a space in the chamber into a processing space where plasma processing is performed on the substrate and an exhaust space connected to the exhaust port, the baffle including a plurality of slits, the plurality of slits each having a width that is smaller than twice a sheath width of a plasma and greater than zero in a shield state in which the baffle shields the plasma from the exhaust space, and the plurality of slits each having a width greater than zero in a transmissive state in which the baffle allows the plasma to pass therethrough;

a switching mechanism configured to switch the baffle between the shield state and the transmissive state; and a controller configured to:

control the switching mechanism to switch the baffle to the transmissive state when plasma cleaning is performed in the chamber, and control the switching mechanism to switch the baffle to the shield state when the plasma is generated in the chamber and the plasma processing is performed on the substrate.

2. The plasma processing apparatus according to claim 1, wherein the switching mechanism is configured to switch the baffle between the shield state and the transmissive state by changing the widths of the plurality of slits.

3. The plasma processing apparatus according to claim 1, wherein the baffle has an opening formed along a periphery of the stage, a plurality of blades fixed to axes are disposed side by side in the opening, the plurality of slits are formed between the plurality of blades, and the switching mechanism is configured to switch the baffle between the shield state and the transmissive state by rotating the axes of the plurality of blades to change the widths of the plurality of slits.

4. The plasma processing apparatus according to claim 2, wherein, in the transmissive state, width of each of the plurality of slits is twice or more the sheath width.

5. The plasma processing apparatus according to claim 1, wherein the switching mechanism is configured to switch the baffle between a ground potential and a floating state, the baffle is in the shield state when the baffle is in the ground potential, and the baffle is in the transmissive state when the baffle is in the floating state.

6. The plasma processing apparatus according to claim 5, wherein the switching mechanism is provided at a connection location between a conductive member set to the ground potential and the baffle, and the switching mechanism is a switch configured to switch the conductive member and the baffle between a conductive state and a non-conductive state.

7. The plasma processing apparatus according to claim 1, wherein the baffle is divided into a plurality of regions along a circumferential direction of the stage, the regions are individually switchable between the shield state and the transmissive state, and the switching mechanism individually switches the regions between the shield state and the transmissive state.

8. The plasma processing apparatus according to claim 7, wherein the controller is configured to:

control the switching mechanism to switch the plurality of regions of the baffle to the shield state when the plasma is generated in the chamber and the plasma processing is performed on the substrate, and control the switching mechanism to switch a part or all of the plurality of regions of the baffle to the transmissive state when the plasma cleaning is performed in the chamber.

9. The plasma processing apparatus according to claim 8, wherein the controller is configured to control the switching mechanism to sequentially switch the regions of the baffle to the transmissive state when the plasma cleaning is performed in the chamber.

10. The plasma processing apparatus according to claim 3, wherein the plurality of blades are configured to be in a horizontal state to establish the shield state.

11. The plasma processing apparatus according to claim 10, wherein the plurality of blades are configured to be in a vertical state to establish the transmissive state.

12. The plasma processing apparatus according to claim 3, wherein the switching mechanism includes a servo motor and a worm gear configured to rotate the axes of the plurality of blades.

13. The plasma processing apparatus according to claim 5, wherein the baffle is provided with a dielectric insulating member to electrically insulate the baffle from a sidewall of the chamber.

14. The plasma processing apparatus according to claim 7, wherein the baffle is divided into four of the plurality of regions.

15. The plasma processing apparatus according to claim 8, wherein the controller is further configured to adjust a plasma density on a surface of the substrate by controlling the switching mechanism to switch a part less than all of the plurality of regions to the transmissive state during the plasma processing performed on the substrate.

16. The plasma processing apparatus according to claim 1, wherein the baffle has a flat annular shape including a stepped portion.

17. A method, comprising:

using a plasma processing apparatus including;

a chamber that is internally provided with a stage on which a substrate is able to be disposed and that is provided with an exhaust port connected to an exhaust system, a baffle provided around the stage and configured to divide a space in the chamber into a processing space where plasma processing is performed on the substrate and an exhaust space connected to the exhaust port, the baffle including a plurality of slits, the plurality of slits each having a width that is smaller than twice a sheath width of a plasma and greater than zero in a shield state in which the baffle shields the plasma from the exhaust space, and the plurality of slits each having a width greater than zero in a transmissive state in which the baffle allows the plasma to pass therethrough, and a switching mechanism configured to switch the baffle between the shield state and the transmissive state, wherein the using includes:

controlling the switching mechanism to switch the baffle to the transmissive state when plasma cleaning is performed in the chamber, and controlling the switching mechanism to switch the baffle to the shield state when the plasma is generated in the chamber and the plasma processing is performed on the substrate.

18. The method according to claim 17, wherein the plasma cleaning is performed using a cleaning gas that removes deposits.

19. The method according to claim 18, wherein the cleaning gas includes a plurality of types of gases.

20. The method according to claim 17, wherein the baffle is divided into a plurality of regions along a circumferential direction of the stage, and the controlling the switching mechanism includes controlling the switching mechanism to sequentially switch the plurality of regions to the transmissive state during the plasma cleaning.

* * * * *